United States Patent
Kim et al.

(10) Patent No.: US 9,928,783 B2
(45) Date of Patent: Mar. 27, 2018

(54) POWER CONTROL DEVICE AND METHOD AND ORGANIC LIGHT EMITTING DISPLAY DEVICE INCLUDING THE SAME

(71) Applicant: LG DISPLAY CO., LTD., Seoul (KR)

(72) Inventors: Hyojin Kim, Paju-si (KR); Suhyuk Jang, Paju-si (KR); Jeonga Lee, Seoul (KR); Jinwon Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/331,100

(22) Filed: Oct. 21, 2016

(65) Prior Publication Data

US 2017/0124960 A1    May 4, 2017

(30) Foreign Application Priority Data

Oct. 29, 2015  (KR) .................. 10-2015-0151333

(51) Int. Cl.
| | |
|---|---|
| *G09G 3/32* | (2016.01) |
| *G09G 3/3291* | (2016.01) |
| *G09G 3/3266* | (2016.01) |
| *H01L 51/52* | (2006.01) |
| *G09G 3/3233* | (2016.01) |

(52) U.S. Cl.
CPC ......... *G09G 3/3291* (2013.01); *G09G 3/3233* (2013.01); *G09G 3/3266* (2013.01); *H01L 51/529* (2013.01); *G09G 2310/08* (2013.01); *G09G 2320/041* (2013.01); *G09G 2330/021* (2013.01); *G09G 2330/028* (2013.01)

(58) Field of Classification Search
CPC ..... G09G 2320/041; G09G 2320/0626; G09G 2360/144; G09G 2360/16; G09G 3/3208; G09G 2310/08; G09G 2330/021; G09G 2330/028; G09G 3/3233; G09G 3/3266; G09G 3/3291; H01L 51/529

See application file for complete search history.

(56) References Cited

U.S. PATENT DOCUMENTS

| | | | |
|---|---|---|---|
| 2005/0140606 A1* | 6/2005 | Choi ................ | G09G 3/3233 345/76 |
| 2007/0018933 A1* | 1/2007 | Lee ................. | G09G 3/3696 345/98 |
| 2011/0205202 A1* | 8/2011 | Son ................. | G09G 3/3208 345/207 |
| 2014/0028652 A1* | 1/2014 | Lin ................. | G09G 5/00 345/212 |
| 2016/0012777 A1* | 1/2016 | An .................. | G09G 3/20 345/212 |
| 2016/0133217 A1* | 5/2016 | Lee ................. | G09G 3/20 345/212 |
| 2016/0189654 A1* | 6/2016 | Kim ................. | G09G 3/3685 345/690 |

* cited by examiner

*Primary Examiner* — Hong Zhou
(74) *Attorney, Agent, or Firm* — Dentons US LLP

(57) ABSTRACT

A power control device includes a temperature sensing unit sensing a temperature of a display panel and outputting a temperature sensing value, a timing controller generating a power control signal, and a power management integrated circuit (PMIC) adjusting a voltage level of high potential driving power to be applied to the display panel on a basis of the power control signal. When a voltage level of VDDEL is adjusted using a S-wire interface scheme, VDDEL is adjusted when the power control signal satisfies a preset condition, whereby an influence of noise is excluded and a stable output may be obtained.

15 Claims, 11 Drawing Sheets

POWER CONTROL DEVICE AND METHOD AND ORGANIC LIGHT EMITTING DISPLAY DEVICE INCLUDING THE SAME

This application claims the benefit of Korea Patent Application No. 10-2015-0151333 filed on Oct. 29, 2015, which is incorporated herein by reference for all purposes as if fully set forth herein.

BACKGROUND OF THE INVENTION

Field of the Invention

The present disclosure relates to a power control device and method and an organic light emitting display device including the same.

Discussion of the Related Art

An active matrix type organic light emitting display device includes a self-luminous organic light emitting diode (OLED) and has many advantages such as fast response speed, high emission efficiency, high luminance, and wide viewing angle.

An OLED typically includes an anode electrode, a cathode electrode, and organic compound layers (hole injection layer (HIL), a hole transport layer (HTL), an emission layer (EML), an electron transport layer (ETL), and an electron injection layer (EIL)) formed therebetween. The organic compound layers include the HIL, HTL, EML, ETL, and EIL. When a driving voltage is applied between the anode electrode and the cathode electrode, holes which have passed through the HTL and electrons which have passed through the ETL move to the EML to form excitons, resultantly causing the EML to emit visible light.

In an organic light emitting display device, pixels each including an OLED are arranged in a matrix, and the brightness of each pixel is adjusted according to a gray level of video data. Each pixel may include a driving thin film transistor (TFT) DT for controlling a driving current applied to the OLED and a switching unit SC for programming a voltage (hereinafter, referred to as "Vgs") between a gate and a source of the driving TFT DT. The driving TFT DT generates a current (hereinafter, referred to as "Ids") between a drain and a source according to the programmed Vgs, and supplies Ids as a driving current to the OLED. Here, a high potential driving power (hereinafter, referred to as "VDDEL") and a low potential driving power (hereinafter, referred to as "VSSEL") are applied to each pixel in order to generate a driving current. An emission amount of the OLED is determined depending on the driving current.

A voltage level of VDDEL is designed to be positioned within a saturation section RG2 on a Vds–Ids plane as illustrated in FIG. 2 in order to secure stability of an operation regarding the driving TFT.

The saturation section RG2 refers to a voltage section in which Ids is not substantially changed in spite of a change in Vds, and is positioned on the right of a boundary point BP on the Vds–Ids plane.

The active section RG1, which is different from the saturation section RG2 with respect to the boundary point BP, refers to a voltage section in which Ids changes according to a change in Vds, and is positioned on the left of the boundary point BP on the Vds–Ids plane.

To allow the driving TFT to constantly operate in the saturation section RG2 in consideration of a process variation of a display panel, VDDEL is determined to have a sufficient voltage margin value Vmg from the boundary point BP as illustrated in FIG. 2. After being determined as a fixed value, VDDEL is commonly applied to every pixel.

Meanwhile, luminance implemented in each pixel is affected by an ambient temperature as illustrated in FIG. 3. When an ambient temperature is lowered in a state in which Vgs of the driving TFT and VDDEL are constant, brightness is also lowered. Such brightness deviation results from the fact that electron mobility properties of the driving TFT are proportional to temperature. The brightness deviation becomes severe as an ambient temperature is lowered. When the brightness deviation is severe, display quality of an image is degraded.

In order to compensate for a brightness deviation according to temperature, a technique of changing a voltage level of FDDEL through a S-wire interface scheme as illustrated in FIG. 4 is known. In the S-wire interface scheme, a power control signal SCON generated by a controller is transmitted to a power management integrated circuit (PMIC) through a single transmission line (or a single wire). The controller differently generates the number of transition pulses included in the power control signal SCON according to temperature. Then, the PMIC counts the number of transition pulses included in the power control signal SCON during a unit time, and adjusts a voltage level of VDDEL according to the counted value. In FIG. 4, PMIC_EN is a control signal for activating an operation of the PMIC.

The related art VDDEL adjustment technique may not have a matching process for determining whether the power control signal SCN output from the controller and the power control signal SCN received by the PMIC match. Thus, if noise is introduced to the power control signal SCON, the PMIC outputs an abnormal voltage due to an influence of noise and a voltage level of VDDEL may then be adjusted to an undesired value.

SUMMARY OF THE INVENTION

Accordingly, the present disclosure is directed to provide a power control device and method and an organic light emitting display device including the same that substantially obviate one or more problems due to limitations and disadvantages of the related art.

An aspect of the present disclosure is to provide a power control device and method capable of obtaining a stable output by excluding an influence of noise when a voltage level of VDDEL is adjusted using a S-wire interface scheme, and an organic light emitting display device including the same.

Additional features and advantages of the present disclosure will be set forth in the description which follows, and in part will be apparent from the description, or may be learned by practice of the invention. These and other advantages of the present invention will be realized and attained by the structure particularly pointed out in the written description and claims hereof as well as the appended drawings.

To achieve these and other advantages and in accordance with the purpose of embodiments of the invention, as embodied and broadly described herein, a power control device may, for example, include a temperature sensing unit sensing a temperature of a display panel and outputting a temperature sensing value: a timing controller generating a power control signal: and a power management integrated circuit (PMIC) adjusting a voltage level of high potential driving power to be applied to the display panel on a basis of the power control signal.

The timing controller may generate a power control signal including a first section in which a start pulse indicating transmission starting is transmitted, a second section in which a binary control value based on the temperature sensing value is transmitted, and a third section in which a transition pulse corresponding to the binary control value is transmitted.

The power management integrated circuit (PMIC) may check the power control signal received from the timing controller through a transmission line, and adjust a voltage level of high potential driving power to be applied to the display panel on a basis of the binary control value when the number of the transition pulses and the binary control value are the same.

In another aspect, an organic light emitting display device may, for example, include a display panel including a plurality of pixels operated according to a high potential driving power, each pixel including an organic light emitting diode (OLED); a temperature sensing unit that senses a temperature of the display panel and outputting a temperature sensing value; a timing controller that generates a power control signal including a first section in which a start pulse indicating transmission starting is transmitted, a second section in which a binary control value based on the temperature sensing value is transmitted, and a third section in which a transition pulse corresponding to the binary control value is transmitted; and a power management integrated circuit (PMIC) that checks the power control signal received from the timing controller through a transmission line, and adjusts a voltage level of high potential driving power on a basis of the binary control value when a number of the transition pulses and the binary control value are the same.

In yet another aspect, a power control method may, for example, include sensing a temperature of a display panel and outputting a temperature sensing value; generating a power control signal including a first section in which a start pulse indicating transmission starting is transmitted, a second section in which a binary control value based on the temperature sensing value is transmitted, and a third section in which a transition pulse corresponding to the binary control value is transmitted; and checking the power control signal received from the timing controller through a transmission line, and adjusting a voltage level of high potential driving power to be applied to the display panel on a basis of the binary control value when a number of the transition pulses and the binary control value are the same.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Hereinafter, embodiments of the present disclosure will be described in detail with reference to FIGS. 6 to 12.

Figure 6:
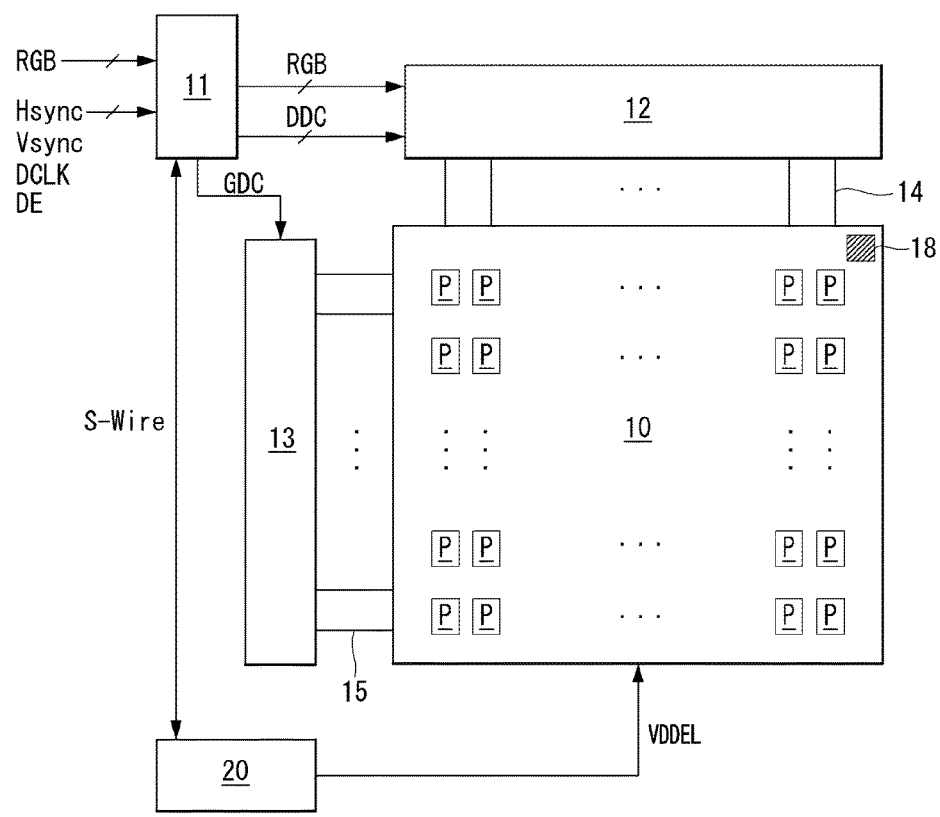
FIG. 6 is a view illustrating an organic light emitting display device according to an embodiment of the present disclosure.
Figure 7:
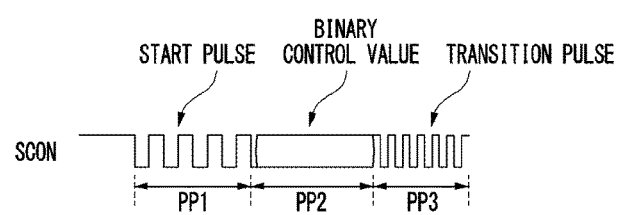
FIG. 7 is a view illustrating a power control signal SCON according to an embodiment of the present disclosure.

FIG. 6 is a view illustrating an organic light emitting display device according to an embodiment of the present disclosure. FIG. 7 is a view illustrating a power control signal SCON according to an embodiment of the present disclosure.

Referring to FIGS. 6 and 7, an organic light emitting display device according to an embodiment of the present disclosure includes a display panel 10, a power control device, a data driving circuit 12, and a gate driving circuit 13. The power control device includes a timing controller 11, a power integrated circuit (IC) 20, and a temperature sensing unit 18.

A plurality of data lines 14 and a plurality of gate lines 15 intersect with each other in the display panel 10, and a pixel P is disposed in a matrix form at every intersection to form a pixel array.

Each pixel P may be connected to any one of the data lines 14 and any one of the gate lines 15. A pixel unit for color representation may include four pixels including a red pixel, a green pixel, a blue pixel, and a white pixel, but the present disclosure is not limited thereto. The pixels P receive VDDEL from a power management integrated circuit (PMIC) 20.

Figure 1:
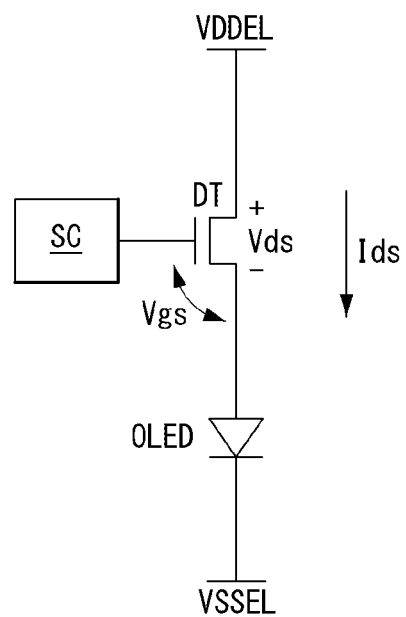
FIG. 1 is a view schematically illustrating a connection configuration of a pixel including an OLED and a driving TFT connected between VDDEL and VDDSL.
Figure 2:
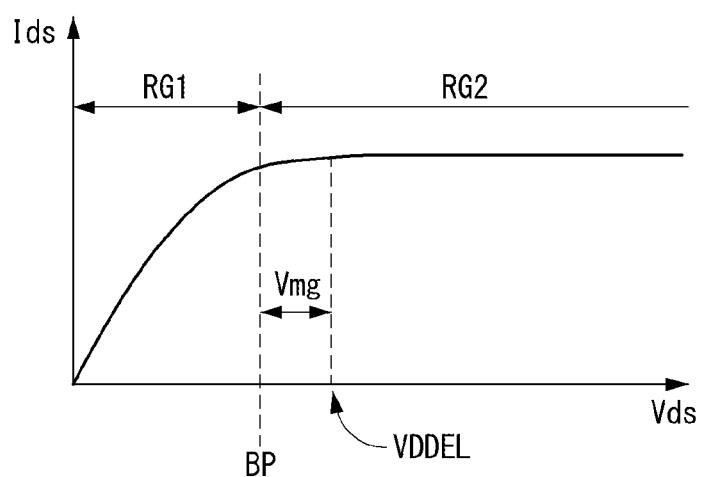
FIG. 2 is a view illustrating an active section and a saturation section differentiated by a boundary point in an operational characteristic curve of a driving TFT.
Figure 3:
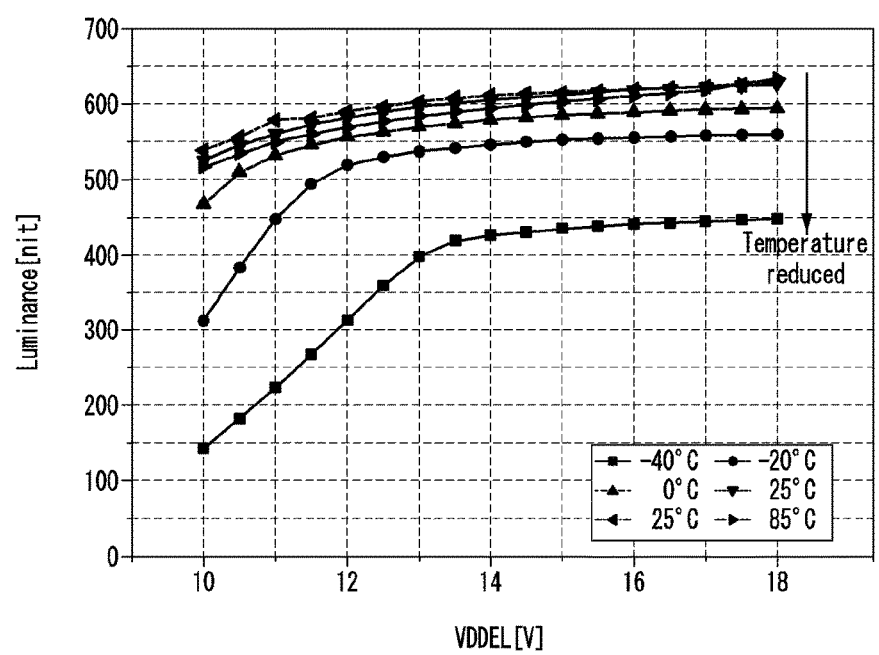
FIG. 3 is a view illustrating operational characteristic curves of a driving TFT varied according to temperature.
Figure 4:
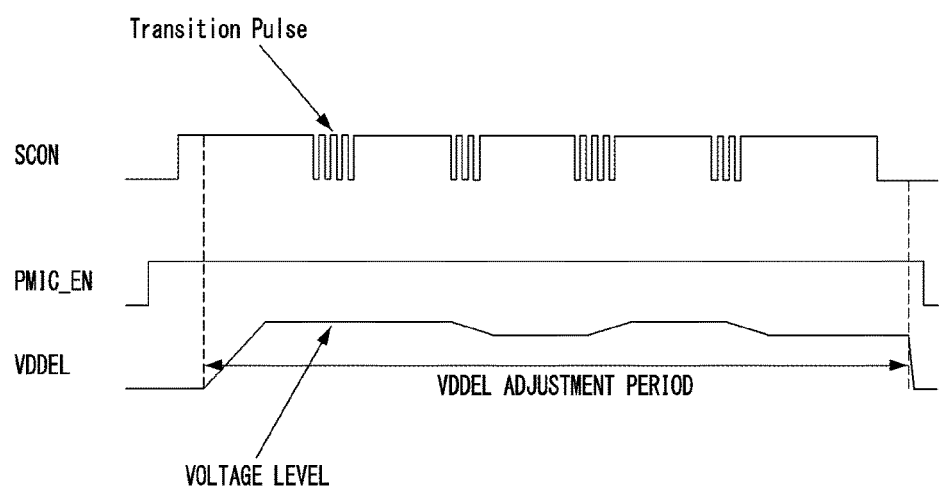
FIG. 4 is a view illustrating a related art VDDEL adjusting technique employing a S-wire interface scheme.
Figure 5:
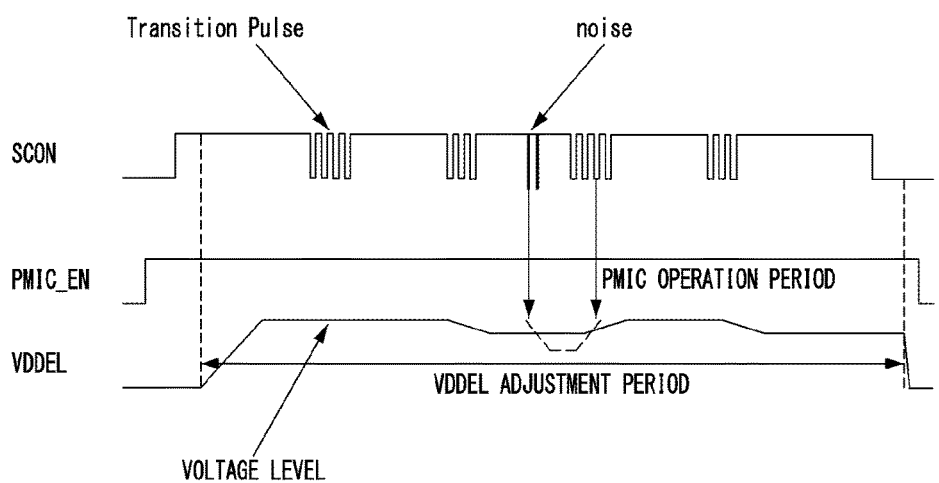
FIG. 5 is a view illustrating distortion of an output due to an influence of noise in the related art VDDEL adjusting technique.

The pixel P of the present disclosure may include an OLED, a driving TFT DT, and a switching unit SC as illustrated in FIG. 1. TFTs may be implemented as P type, N type, or a hybrid type including P type and N type. Also, a semiconductor layer of a TFT may include an amorphous silicon, a polysilicon, or an oxide.

The OLED includes an anode electrode connected to a source electrode of the driving TFT DT, a cathode electrode connected to an in put terminal of a VSSEL, and an organic compound layer positioned between the anode electrode and the cathode electrode. The organic compound layer may include a hole injection layer (HIL), a hole transport layer (HTL), an emission layer (EML), an electron transport layer (ETL), and an electron injection layer (EIL).

The driving TFT DT controls a magnitude of Ids of the driving TFT DT input to the OLED according to Vgs. The driving TFT DT includes a gate electrode connected to a gate node, a drain electrode connected to an input terminal of VDDEL, and a source electrode connected to an anode electrode of the OLED.

The switching unit SC may include at least one switching TFT and a storage capacitor. The storage capacitor may be connected between the gate electrode and the source electrode of the driving TFT DT to maintain Vgs of the driving TFT DT during a predetermined period of time. The switching TFT may switch electrical connection between the gate electrode of the driving TFT DT and a data line 14 according to a scan control signal.

The organic light emitting display device having such a pixel array may employ an internal compensation technique or an external compensation technique. The internal compensation technique is a technique of automatically compensating for a brightness deviation due to a threshold voltage shift of the driving TFT DT within a pixel circuit using a diode connection scheme, a source follower scheme, and the like. The external compensation technique is a technique of sensing electrical characteristics of the OLED and the driving TFT DT provided in the pixels and correcting input video data according to the sensing value. Electrical characteristics of the driving TFT refer to a threshold voltage of the driving TFT and electron mobility of the driving TFT.

The organic light emitting display device including a pixel array for external compensation is disclosed in Korean Patent Application No. 10-2013-0134256 (dated Nov. 6, 2013), Korean Patent Application No. 10-2013-0141334 (dated Nov. 20, 2013), Korean Patent Application No. 10-2013-0149395호 (dated Dec. 3, 2013), Korean Patent Application No. 10-2014-0086901 (dated Jul. 10, 2014), Korean Patent Application No. 10-2014-0079255 (Jun. 26, 2014), Korean Patent Application No. 10-2014-0079587 (Jun. 27, 2014), Korean Patent Application No. 10-2014-0119357 (dated Sep. 5, 2014) filed by the applicant of the present application.

In the display panel 10, a temperature sensing unit 18 may be installed in a non-display area outside the pixel array. The temperature sensing unit 18 may sense a temperature of the display panel 10 according to a surrounding environment, and supply a temperature sensing value to the timing controller 11. The temperature sensing unit 18 may also be installed in a control board on which the timing controller 11 is mounted.

The timing controller 11 receives a temperature sensing value from the temperature sensing unit 18, and generates a power control signal SCON on the basis of the temperature sensing value. The power control signal SCON includes three transmission sections to allow a check processor for disregarding noise introduction to be easily implemented. That is, as illustrated in FIG. 7, the power control signal SCON includes a first section PP1 in which a start pulse indicating transmission start, a second section PP2 in which a binary control value based on a temperature sensing value is transmitted, and a third section PP3 in which a transition pulse corresponding to a binary control value is transmitted. The timing controller 11 transmits the power control signal SCON to the PMIC 20 through a S-wire interface scheme.

The PMIC 20 may generate VDDEL to be applied to the display panel 10 and change a voltage level of the VDDEL on the basis of the power control signal SCON transmitted from the timing controller 11. The PMIC 20 checks the power control signal SCON received through a single transmission line to check validity of the power control signal SCON. The PMIC 20 may check validity of the power control signal SCON by inspecting suitability of the start pulse, sameness between the number of transition pulses and the binary control value, and the like. Also, the PMIC 20 may set a maximum count period for counting the number of transition pulses, and does not count a transition pulse input beyond the maximum count period, thereby accurately calculating the number of transition pulses. The PMIC 20 adjusts a voltage level of the VDDEL only when a normal power control signal SCON is received.

The timing controller 11 generates a data control signal DDC for controlling an operation timing of the data driving circuit 12 and a gate control signal GDC for controlling an operation timing of the gate driving circuit 13 on the basis of timing signals such as a vertical synchronization signal Vsync, a horizontal synchronization signal Hsync, a dot clock signal DCLK, a data enable signal DE, and the like.

The gate control signal GDC includes a gate start pulse GSP, a gate shift clock GSC, a gate output enable GOE, and the like. The gate start pulse GSP is applied to the gate stage that generates a first scan signal, and controls the gate stage to generate the first scan signal. The gate shift clock GSC, a clock signal commonly input to gate stages, is a clock signal for shifting the gate start pulse GSP. The gate output enable signal GOD is a masking signal for controlling output of the gate stages.

The data control signal DDC includes a source start pulse SSP, a source sampling clock SSC, a source output enable signal SOE, and the like. The source start pulse SSP controls a data sampling start timing of the data driving circuit 12. The source sampling clock SSC is a clock signal for controlling a sampling timing of data in each of the source drive ICs with respect to a rising or falling edge. The source output enable signal SOE controls an output timing of the data driving circuit 12.

The data driving circuit 12 may include at least one source driver IC. The source driver IC includes a latch array and a plurality of digital-to-analog converters (DACs) connected to each data line 14. The latch array latches digital video data RGG input from the timing controller 11 on the basis of the data control signal DDC and supplies the latched digital video data to the DACs. The DACs convert the digital video data RGB input from the timing controller into a data voltage and output the converted data voltage to the data lines 14.

The gate driving circuit 13 generates a scan control signal SCAN on the basis of the gate control signal GDC and subsequently supplies the generated scan control signal SCAN to the gate lines 15. The gate driving circuit 13 may be directly formed on a non-display area of the display panel 10.

Figure 8:
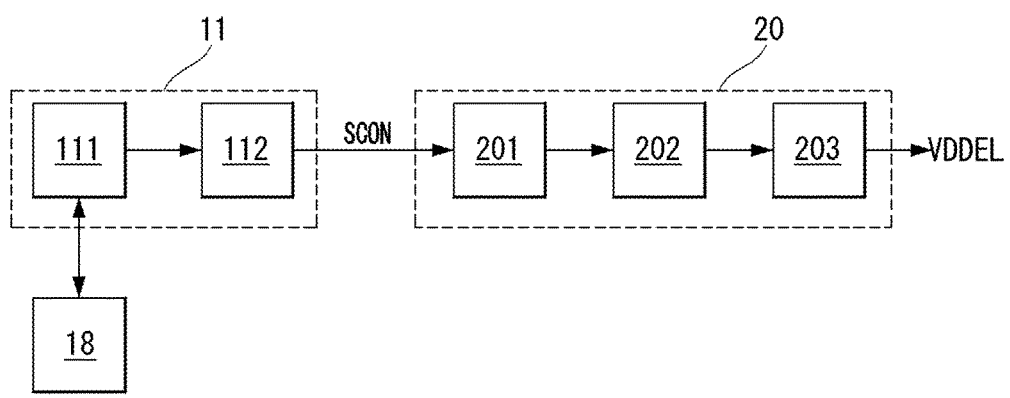
FIG. 8 is a view illustrating a specific configuration of a power control device according to an embodiment of the present disclosure.
Figure 9:
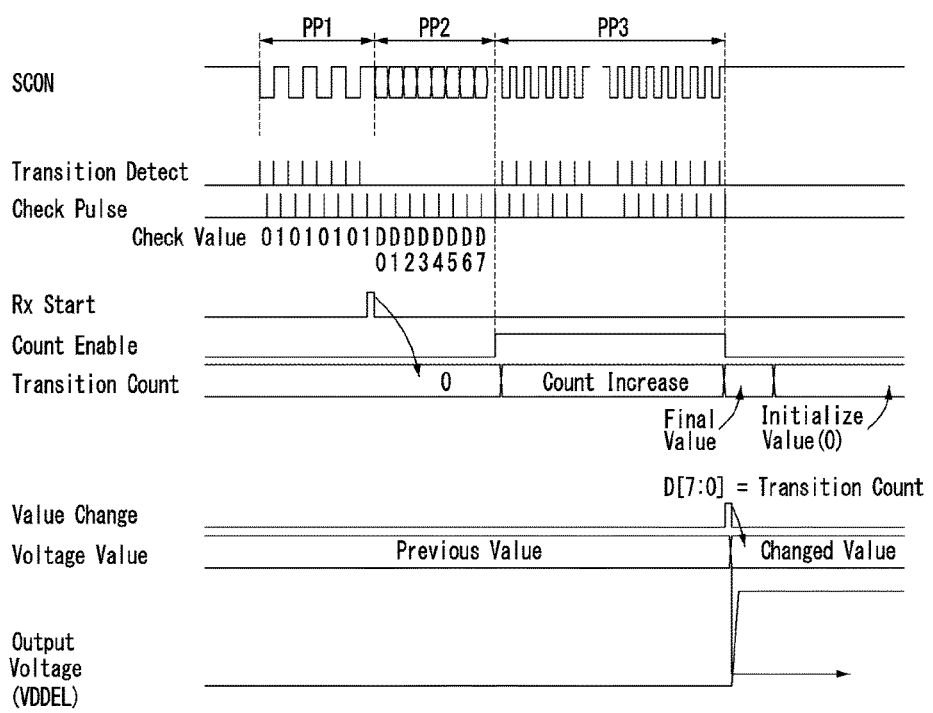
FIG. 9 is a view illustrating a power control signal SCON and operations of a power control device according to the power control signal SCON.
Figure 10:
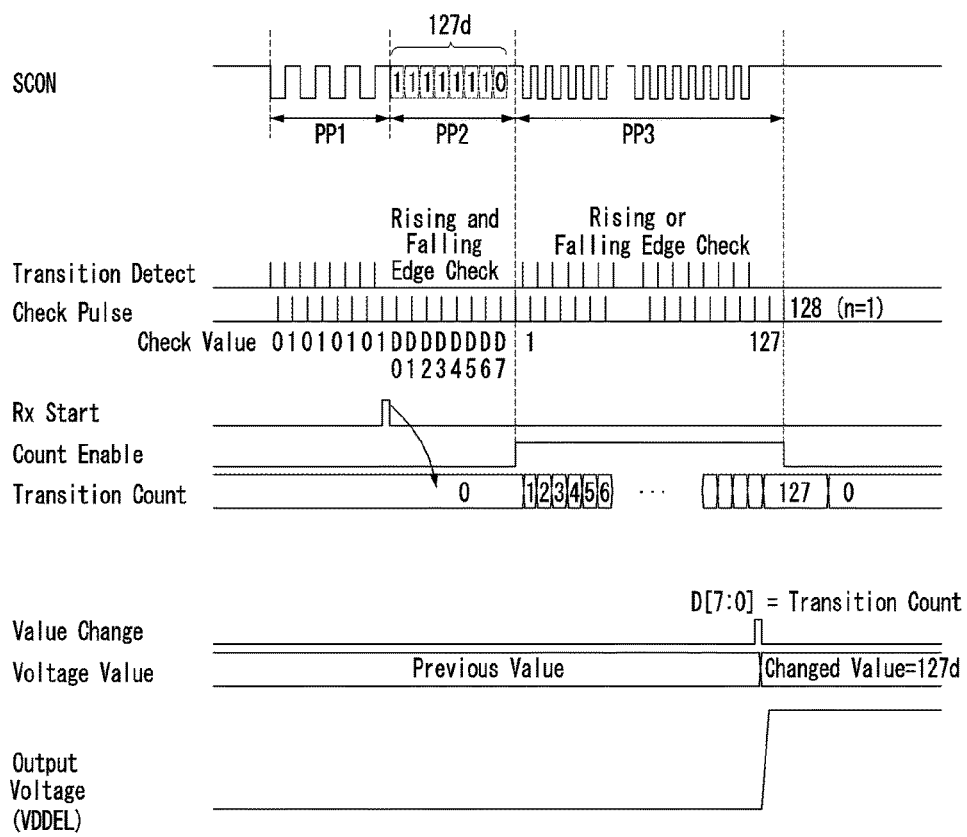
FIG. 10 is a view illustrating an example of FIG. 9 in which a binary control value is "127."

FIG. 8 is a view illustrating a specific configuration of a power control device according to an embodiment of the present disclosure. FIG. 9 is a view illustrating a power control signal SCON and operations of a power control device according to the power control signal SCON. FIG. 10 is a view illustrating an example of FIG. 9 in which a binary control value is "127".

Referring to FIG. 8, the power control device according to an embodiment of the present disclosure includes a timing controller 11, a power management integrated circuit (PMIC) 20, and a temperature sensing unit 18.

The timing controller 11 includes a signal generating unit 111 and a signal transmitting unit 112. The signal generating unit 111 generates a power control signal SCON on the basis of a temperature sensing value from the temperature sensing unit 18. In the power control signal SCON, a start pulse of a first section PP1 is a flag signal indicating transmission starting, which is set to a specific value according to a previously agreed protocol. For example, the start pulse of the first section PP1 may be set to a 8-bit flag signal "01010101" as illustrated in FIGS. 9 and 10.

In the power control signal SCON, a binary control value of a second section PP2 is to adjust a voltage level of the VDDEL, which is generated to be different according to a temperature sensing value. For example, a binary control value of the second section PP2 may be "1111111_binary", i.e., "127_digital", as illustrated in FIG. 10.

In the power control signal SCON, a transition pulse of a third section PP3 is to adjust a voltage level of the VDDEL, which is generated to be different according to a temperature sensing value. In particular, the number of transition pulses is set to be the same as that of the binary control value of the second section PP2. For example, in a case in which the binary control value of the second section PP2 is "127_digital" as illustrated in FIG. 10, 127 transition pulses are generated.

The signal transmitting unit 112 transmits the power control signal SCN generated by the signal generating unit 111 to the PMIC 20 through a single transmission line according to a S-wire interface scheme.

The PMIC 20 includes a signal receiving unit 201, a validity checking unit 202, and a VDDEL adjusting unit 203.

The signal receiving unit 201 receives the power control signal SCON transmitted from the timing controller 11 according to the S-wire interface scheme.

The validity checking unit 202 checks the received power control signal SCON to determine validity of the power control signal SCON. The validity checking unit 202 receives a reference pulse synchronized with digital video data RGB of an input image from the timing controller 11, and subsequently generates a check pulse using the reference pulse as a reference clock. Also, the validity checking unit 202 samples the power control signal SCON on the basis of the check pulse to inspect suitability of the start pulse, sameness between the number of transition pulses and the binary control value, and the like.

In order to increase accuracy of the sampling operation regarding the power control signal SCON, the validity checking unit 202 may determine a sampling width with respect to a transition edge of the power control signal SCON and generate a check pulse at the center of the sampling width as illustrated in FIGS. 9 and 10. In detail, the validity checking unit 202 detects a transition edge from each of a rising edge and a falling edge of the power control signal SCON in the first section PP1 and the second section PP2, and detects a transition edge from any one of a rising edge and a falling edge of the power control signal SCON in the third section PP3. After checking a pulse width of the start pulse in the first section PP1, the validity checking unit 202 determines a sampling width by the pulse width interval, and generates a check pulse at the center of the sampling width. Thus, the check pulse is generated at the pulse width interval of the start pulse.

The validity checking unit 202 may check a logic value and a binary control value of the start pulse according to the check pulse. The validity checking unit 202 checks the logic value of the start pulse, and only when the logic value of the start pulse satisfies a preset value (e.g., "01010101"), the validity checking unit 202 may generate a reception control signal (Rx start signal) and starts an Rx sequence for receiving the binary control value and the transition pulse on the basis of the reception control signal (Rx start signal).

In order to accurately calculate the number of transition pulses, the validity checking unit 202 previously sets a maximum count period (corresponding to a pulse width of a count enable signal) for counting the number of transition pulses within the third section PP3 with respect to the pulse width of the start pulse, counts the number of transition pulses only during the maximum count period, and does not count a transition pulse input beyond the maximum count period.

The validity checking unit 202 generates a voltage change signal (or a value change signal) only when the number of the transition pulses and the binary control value are the same.

Through the inspection process, the validity checking unit 202 may determine whether the received power control signal is normal, and output a check result signal to the VDDEL adjusting unit 203.

Only when a normal power control signal SCON is received on the basis of the check result signal, the VDDEL adjusting unit 203 adjusts a voltage level of the VDDEL, and in a case in which an abnormal power control signal SCON is received, the VDDEL adjusting unit 203 maintains the state, without adjusting a voltage level of the VDDEL. Thus, a problem in which the VDDEL is erroneously adjusted due to an influence of noise may be prevented in advance.

Figure 11:
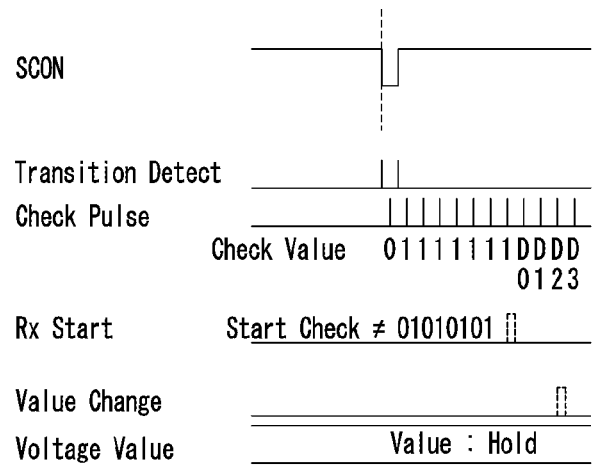
FIG. 11 is a view illustrating an operation of a power control device according to an embodiment of the present disclosure when noise is introduced.

FIG. 11 is a view illustrating an operation of a power control device according to an embodiment of the present disclosure when noise is introduced.

Referring to FIG. 11, the PMIC 20 detects two transition edges regarding the power control signal SCON, and generates a check pulse at a pulse width interval of the power control signal SCON. The PMIC 20 checks a logic value of the power control signal SCON through the check pulse. Here, the logic value of the power control signal SCON is "01111111" and it does not satisfy a preset start check value (e.g., "01010101"). In this case, the PMIC 20 does not generate a reception control signal (Rx start signal), thus stopping entry to an Rx sequence. As a result, a voltage change signal (or a value change signal) is not generated, and a voltage level of DDEL is not changed and a current voltage state is maintained as is.

Figure 12:
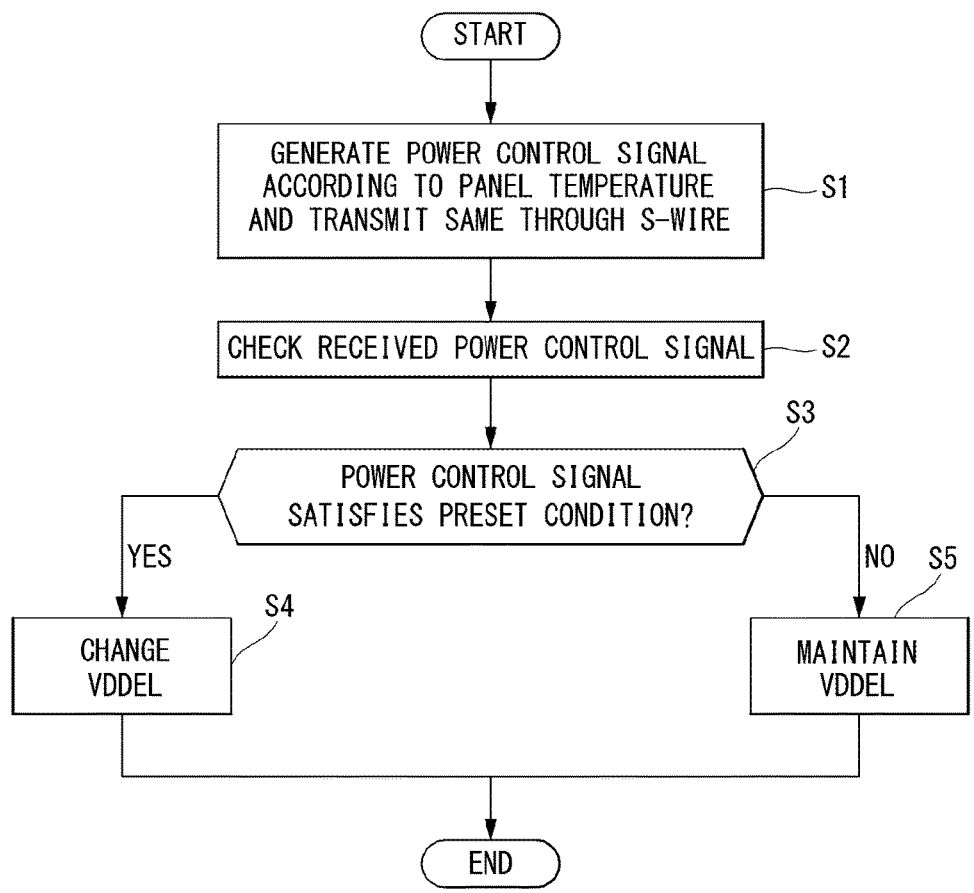
FIG. 12 is a flow chart illustrating a power control method according to an embodiment of the present disclosure.

FIG. 12 is a flow chart illustrating a power control method according to an embodiment of the present disclosure.

A power control method according to an embodiment of the present disclosure is substantially the same as that described above. Briefly, referring to FIG. 12, in the power control method according to an embodiment of the present disclosure, after the timing controller generates a power control signal according to a temperature of the panel, the timing controller transmits the generated power control signal to the PMIC according to a S-wire interface scheme (S1).

In the power control method according to an embodiment of the present disclosure, the PMIC receives the power control signal and checks validity of the received power control signal (S2).

In the power control method according to an embodiment of the present disclosure, it is determined whether the power control signal satisfies a preset condition (S3). The preset condition may include suitability of the start pulse, sameness between the number of transition pulses and the binary control value, and the like.

In the power control method according to an embodiment of the present disclosure, when the power control signal does not satisfy the preset condition, VDDEL is changed in response to a change in a temperature of the panel, or otherwise, the VDDEL is not changed and a current voltage level is maintained (S4 and S5).

In an embodiment of the present disclosure, by a method of measuring a transition waveform of the power control signal transmitted and received between the timing controller and the PMIC, whether wave forms regarding a first section of the power control signal are the same may be checked, regardless of an output voltage, and thus, an application thereof can be easily checked in the display device.

In an embodiment of the present disclosure, whether the power control signal includes three transmission sections may be known by a method of measuring a transition waveform of the power control signal and an output voltage waveform of the PMIC, and in addition, since a change in an output voltage of the PMIC is checked only when a binary control value of the second section and the transition pulse of the third section are the same, an application thereof can be easily checked in the display device.

In this manner, in an embodiment of the present disclosure, when a voltage level of VDDEL is adjusted using the S-wire interface scheme, VDDEL is adjusted only when the power control signal satisfies a preset condition, whereby an influence of noise is excluded and a stable output may be obtained.

While exemplary embodiments have been shown and described above, it will be apparent to those skilled in the art that modifications and variations could be made without departing from the scope of the present invention as defined by the appended claims.

What is claimed is:

1. A power control device comprising:
   a temperature sensing unit that senses a temperature of a display panel and outputs a temperature sensing value;
   a timing controller that generates a power control signal including a first section in which a start pulse indicating transmission starting is transmitted, a second section in which a binary control value based on the temperature sensing value is transmitted, and a third section in which a transition pulse corresponding to the binary control value is transmitted; and
   a power management integrated circuit (PMIC) that checks the power control signal received from the timing controller through a transmission line, and adjusts a voltage level of high potential driving power to be applied to the display panel on a basis of the binary control value when a number of the transition pulses and the binary control value are the same.

2. The power control device of claim 1, wherein when the number of the transition pulses and the binary control value are different, the PMIC does not change the voltage level of the high potential driving power and maintains a current state.

3. The power control device of claim 1, wherein the PMIC checks a logic value of the start pulse, and only when the logic value of the start pulse satisfies a preset value, the PMIC generates a reception control signal and starts a reception sequence for receiving the binary control value and the transition pulse on the basis of the reception control signal.

4. The power control device of claim 1, wherein the PMIC generates a check pulse at a pulse width interval of the start pulse and subsequently checks the logic value of the start pulse and the binary control value according to the check pulse.

5. The power control device of claim 1, wherein the PMIC previously sets a maximum count period for counting the number of the transition pulses within the third section with respect to a pulse width of the start pulse, and counts the number of the transition pulses only during the maximum count period.

6. An organic light emitting display device comprising:
   a display panel including a plurality of pixels operated according to a high potential driving power, each pixel including an organic light emitting diode (OLED);
   a temperature sensing unit that senses a temperature of the display panel and outputting a temperature sensing value;
   a timing controller that generates a power control signal including a first section in which a start pulse indicating transmission starting is transmitted, a second section in which a binary control value based on the temperature sensing value is transmitted, and a third section in which a transition pulse corresponding to the binary control value is transmitted; and
   a power management integrated circuit (PMIC) that checks the power control signal received from the timing controller through a transmission line, and adjusts a voltage level of high potential driving power on a basis of the binary control value when a number of the transition pulses and the binary control value are the same.

7. The organic light emitting display device of claim 6, wherein when the number of the transition pulses and the binary control value are different, the PMIC does not change the voltage level of the high potential driving power and maintains a current state.

8. The organic light emitting display device of claim 6, wherein the PMIC checks a logic value of the start pulse, and only when the logic value of the start pulse satisfies a preset value, the PMIC generates a reception control signal and starts a reception sequence for receiving the binary control value and the transition pulse on the basis of the reception control signal.

9. The organic light emitting display device of claim 6, wherein the PMIC generates a check pulse at a pulse width interval of the start pulse and subsequently checks the logic value of the start pulse and the binary control value according to the check pulse.

10. The organic light emitting display device of claim 6, wherein the PMIC previously sets a maximum count period for counting the number of the transition pulses within the third section with respect to a pulse width of the start pulse, and counts the number of the transition pulses only during the maximum count period.

11. A power control method comprising:
   sensing a temperature of a display panel and outputting a temperature sensing value;
   generating a power control signal including a first section in which a start pulse indicating transmission starting is transmitted, a second section in which a binary control value based on the temperature sensing value is transmitted, and a third section in which a transition pulse corresponding to the binary control value is transmitted; and
   checking the power control signal received from the timing controller through a transmission line, and adjusting a voltage level of high potential driving power to be applied to the display panel on a basis of the binary control value when a number of the transition pulses and the binary control value are the same.

12. The power control method of claim 11, wherein, in the adjusting of the voltage level of the high potential driving power,
   when the number of the transition pulses and the binary control value are different, the voltage level of the high potential driving power is not changed but maintained as is.

13. The power control method of claim 11, wherein, in the adjusting of the voltage level of the high potential driving power, a logic value of the start pulse is checked, and only when the logic value of the start pulse satisfies a preset value, a reception control signal is generated and a reception sequence for receiving the binary control value and the transition pulse on the basis of the reception control signal starts.

14. The power control method of claim 11, wherein, in the adjusting of the voltage level of the high potential driving power, after a check pulse is generated at a pulse width interval of the start pulse, the logic value of the start pulse and the binary control value are checked according to the check pulse.

15. The power control method of claim 11, wherein, in the adjusting of the voltage level of the high potential driving power, a maximum count period for counting the number of the transition pulses within the third section with respect to a pulse width of the start pulse is previously set, and the number of the transition pulses is counted only during the maximum count period.

* * * * *